(12) United States Patent
Takano

(10) Patent No.: US 6,900,681 B2
(45) Date of Patent: May 31, 2005

(54) PHASE INTERPOLATOR AND RECEIVER FOR ADJUSTING CLOCK PHASES INTO DATA PHASES

(75) Inventor: Midori Takano, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/634,593

(22) Filed: Aug. 4, 2003

(65) Prior Publication Data

US 2004/0189363 A1 Sep. 30, 2004

(30) Foreign Application Priority Data

Mar. 26, 2003 (JP) ...................................... P2003-086293

(51) Int. Cl.[7] .............................................. H03K 3/017
(52) U.S. Cl. ......................... 327/175; 327/163; 375/376
(58) Field of Search ................................ 327/141, 156, 327/161–163, 175; 375/376

(56) References Cited

U.S. PATENT DOCUMENTS 5,572,158 A * 11/1996 Lee et al. .................... 327/175
6,169,434 B1    1/2001 Portmann .................... 327/175

* cited by examiner

*Primary Examiner*—Kenneth B. Wells
(74) *Attorney, Agent, or Firm*—DLA Piper Rudnick Gray Cary US LLP

(57) ABSTRACT

An aspect of the present invention provides a phase interpolator for adjusting a phase of differential clock signals of a receiver to a phase of a data from a transmitter that includes, an integrator configured to slew edges of differential clock signals adjusted to the phase of the data from the transmitter, a output buffer configured to amplify an output of the integrator, a duty cycle correction circuit configured to feed duty correction signals back to the adjusted differential clock signals, and a controller configured to ensure operations of an amplitude of the output buffer and a data read circuit to adjust the swings and duties of the adjusted differential clock signals.

19 Claims, 15 Drawing Sheets

PHASE INTERPOLATOR AND RECEIVER FOR ADJUSTING CLOCK PHASES INTO DATA PHASES

CROSS REFERENCE TO RELATED APPLICATIONS

This application claims benefit of priority under 35 USC 119 based on Japanese Patent Application No. P2003-086293 filed on Mar. 26, 2003, the entire contents of which are incorporated by reference herein.

BACKGROUND OF THE INVENTION

1. Field of the Invention

The present invention relates generally to a phase interpolator and receiver, and more particularly, to a phase interpolator and receiver capable of ensuring operations to adjust clock phases into data phases.

2. Description of Related Art

FIG. 11 is a block diagram showing a high-speed input/output (I/O) device. A transmitter 4 converts input parallel data 1 into serial data 2. In this specification, the serial data is differential pair signals from CML (current mode logic). The converted serial data 2 is transmitted to a receiver 5. The receiver 5 receives the serial data 2 and converts it into parallel data 3. The serialization of parallel data into serial data and the deserialization of serial data into parallel data are carried out in synchronization with clock signals. The aerial data 2 from the transmitter 4 is asynchronous with the clock signals of the receiver 4. To correctly read the serial data 2 in the receiver 5, the serial data 2 must be synchronized with the clock signals. To achieve this, the phases of the clock signals must be synchronized with those of the serial data 2. To provide a function of adjusting the phases of clock signals to those of serial data, a phase interpolator (abbreviated as PI) and a data road circuit are employed.

FIG. 12 is a timing chart showing serial data 2' supplied to a data read circuit and four-phase clock signals provided from a phase interpolator to the data read circuit. Among the four-phase clock signals, the signals Reclock_InIP 91 (positive=0) and Reclock_InIN 93 (negative=0) hit waveform centers of the serial data 2', to correctly read the serial data 2'. If these clock signals hit the serial data 2' shift, the serial data 2' will incorrectly be read causing malfunctions in a receiver.

The signals Reclock_InIP 91 and Reclock_InIN 93 form a pair. Shifted from these signals by 90 degrees are signals Reclock_InQP and Reclock_InQN that form another pair.

FIG. 13 is a timing chart showing the clock signals Reclock_InIP 91 and Reclock_InIN 93 that have an improper duty ratio deviating from a proper duty ratio of 50:50 due to, for example, noise. The clock signal Reclock_InIP 91 hits a waveform center of the serial data 2'. The clock signal Reclock_InIN 93, however, hits a data transient position of the serial data 2' due to the duty ratio deviation. This will cause a data read error.

FIG. 14 is a schematic view showing an output circuit of a phase interpolator according to a related art. A mixer 52 provides signals 61. These signals are slewed by an integrator 62, and the slewed signals are sent to an output buffer 63. The output buffer 63 amplifies the signals and provides output signals 65. The output signals 65 are sent to a data read circuit (not shown) and to a duty cycle correction circuit (DCC) 64 to correct duty ratios. The DCC 64 feeds duty correction signals back to the signals 61. The DCC 64 is capable of correcting the duty ratios of the signals 61.

The phase interpolator according to the related art, however, causes fluctuations in the voltage of the signals 61 due to parasitic capacitance and coupling capacitance that are affected by the operation of peripheral circuits.

FIG. 15 is a diagram showing signals 61' that are affected by voltage fluctuations. The signals 61' involve varying positive and negative voltage levels that move oppositely due to the CML (current mode logic), causing a small swing zone of reduced amplitude. The small swing zone is insufficiently amplified by the output buffer 63, and therefore, will not be recognized as a clock pulse by a data read circuit. In addition, the voltage variations deteriorate duty ratios, making the data read circuit unable to correctly read data.

SUMMARY OF THE INVENTION

An aspect of the present invention provides a phase interpolator for adjusting a phase of differential clock signals of a receiver to a phase of data from a transmitter that includes, an integrator configured to slew edges of differential clock signals adjusted to the phase of the data from the transmitter, a output buffer configured to amplify an output of the integrator, a duty cycle correction circuit configured to feed duty correction signals back to the adjusted differential clock signals, and a controller configured to ensure operations of an amplitude of the output buffer and a data read circuit to adjust the swings and duties of the adjusted differential clock signals.

Another aspect of the present invention provides a phase interpolator that includes, an integrator configured to receive adjusted differential clock signals, the integrator configured to slew the differential clock signals, a output buffer configured to amplify an output of the integrator, a duty cycle correction circuit configured to receive amplified signals from the output buffer to adjust phases of the amplified signals, the duty cycle correction circuit configured to feed the adjusted signals back to the output buffer, and a controller configured to control a rate of slewing the differential clock signals carried out by the integrator, when swings of the differential clock signals are below a predetermined value.

Another aspect of the present invention provides a receiver that includes, a digital-analog converter configured to convert an inputted signal into a current, a mixer configured to receive an output of the digital-analog converter and a clock, the mixer configured to shift a phase of the clock according to the output of the digital-analog converter to output adjusted differential clock signals, an integrator configured to receive data and adjusted differential clock signals, the integrator configured to slew the differential clock signals, a output buffer configured to amplify an output of the integrator, a duty cycle correction circuit configured to receive amplified signals from the output buffer to adjust a phase of the amplified signal, the duty cycle correction circuit configured to feed the adjusted signals back to the output buffer, and a controller configured to control a rate of the slewing the differential clock signals carried out by the integrator, when swings of the differential clock signals are below a predetermined value, and a data read unit configured to read data using the output of the output buffer.

DETAILED DESCRIPTION OF EMBODIMENTS

Figure 1:
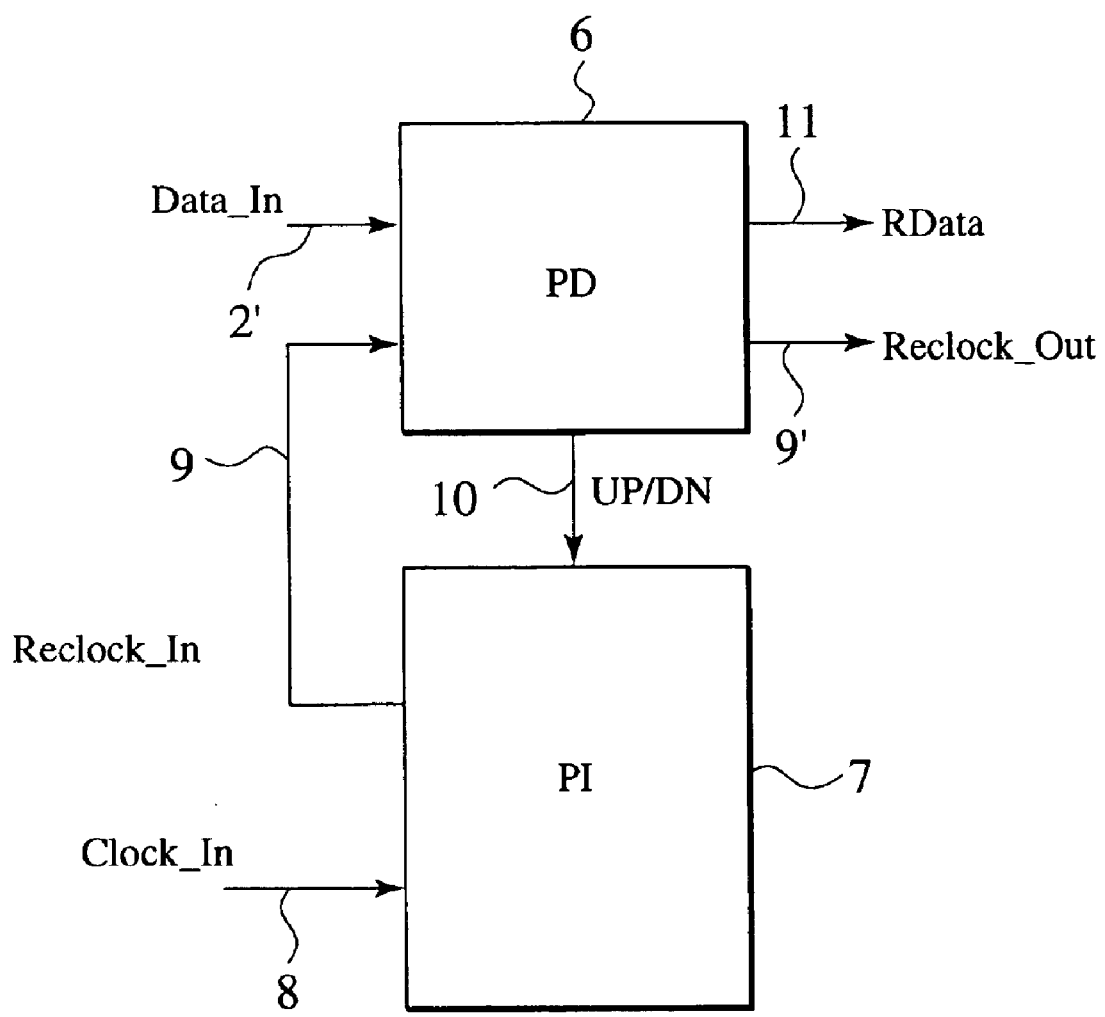
FIG. 1 is a block diagram showing a receiver according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a block diagram showing a receiver according to an embodiment of the present invention. The receiver includes a data read circuit 6 and a phase interpolator 7. The phase interpolator 7 receives four-phase (0, .pi./2, .pi., 3.pi./2) clock signals (Clock_In, CML) 8 and provides four-phase clock signals (Reclock_In) 9 whose phases are synchronous with those of serial data 2'. The serial data 2', is sent from a transmitter (not shown) to the data read circuit 6. The data read circuit 6 reads the serial data 2', based on the clock signals 9, provides the phase interpolator 7 with a phase information signal (UP/DN) 10 containing information about the phases of the clock signals and serial data 21 and outputs data 11, which is synchronous with clock signals in the receiver, and clock signals 9', which have phases synchronized with those of the data 11, to subsequent circuits for further processing.

Figure 2:
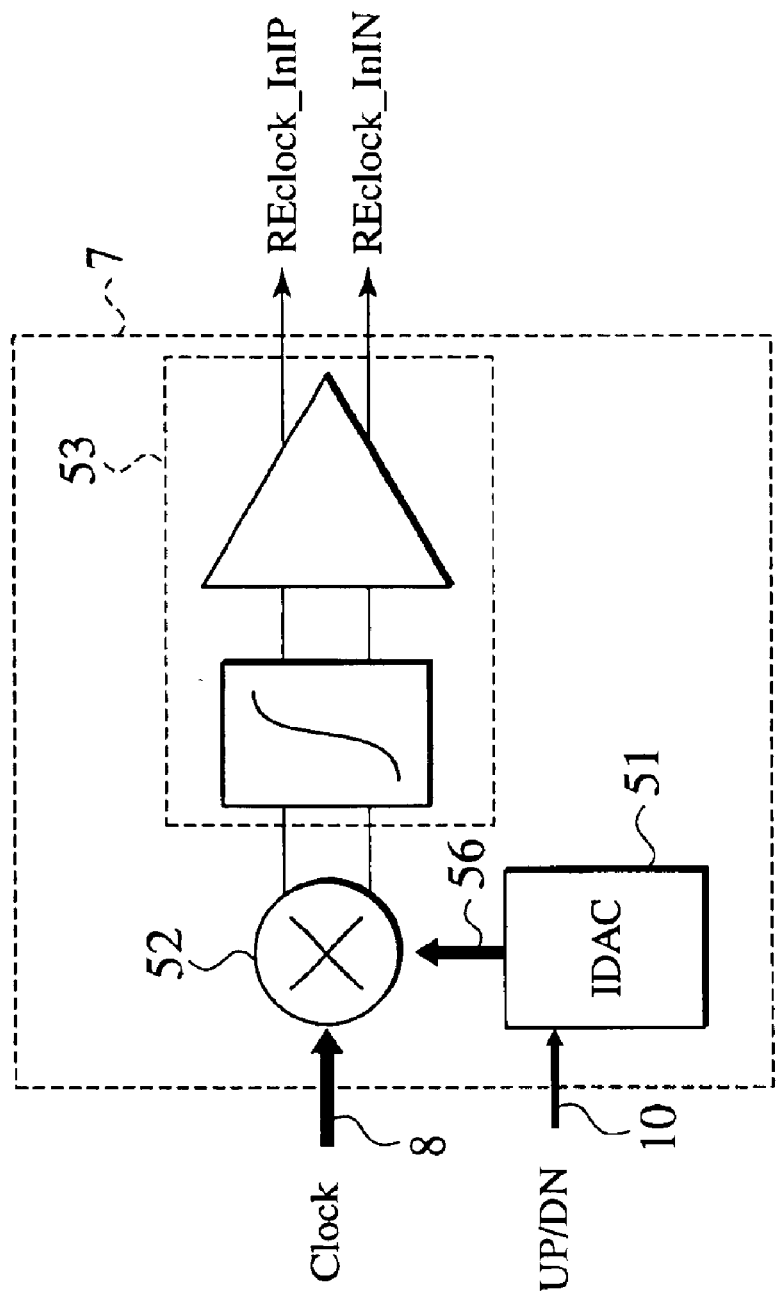
FIG. 2 is a schematic view showing the phase interpolator 7 according to the embodiment.

FIG. 2 is a schematic view showing the phase interpolator 7 according to the embodiment. The phase interpolator 7 has an IDAC (switched current digital to analog converter) controller 51 to convert an input signal into a current output 56, a mixer 52 to receive the output 56 of the IDAC controller 51 and the clock signals 8, shift the phases of the clock signals 8 according to the output 56, and provide differential clock signals, and an output circuit 53 to receive the outputs of the mixer 52.

The phase information signal 10 from the data read circuit 6 (not shown in FIG. 2) is received by the IDAC controller 51, which converts the signal 10 into the current signal 56 indicative of an up/down current value. The four-phase clock signals 8 are received by the mixer 52, which mixes the clock signals 8 with the current signal 56, shifts the phases of the clock signals 8, and provides the phase-shifted clock signals to the output circuit 53.

Figure 3:
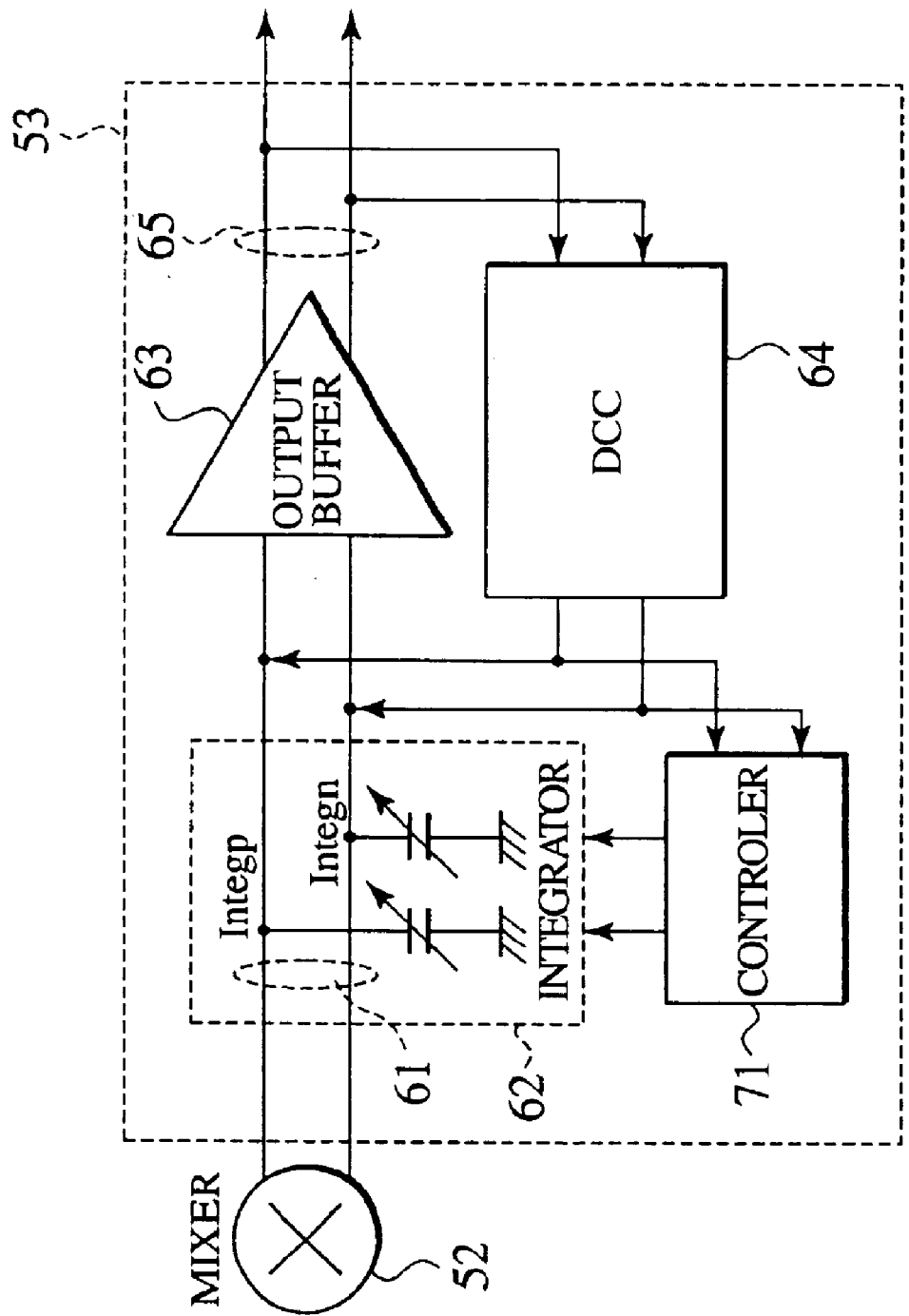
FIG. 3 shows the output circuit 53 according to the embodiment.

FIG. 3 shows the output circuit 53 according to the embodiment. The output circuit 53 has an integrator 62 to receive and modify the differential clock signals 61 whose phases have been adjusted to those of data, an output buffer 63 to amplify the outputs of the integrator 62, a duty correction circuit 64 to receive the amplified signals from the output buffer 63, adjust the phases of the received signals, and feed phase adjusted signals back to the output buffer 63, and a controller 71 to control the modification carried out by the integrator 62 on the differential clock signals 61. The controller 71 checks to see if the voltage of the output signals 61 from the mixer 52 is amplifiable by the output buffer 63, and according to a result of the checking, changes the capacitance of the integrator 62. The integrator 62 makes a signal incline so as to reduce the influence of phase shift by phase insertion. Namely, the integrator 62 makes a signal waveform more slewed. By changing the capacitance of the integrator 62, it is possible to control the rising speed of each clock signal edge and restore the amplitude of each clock signal to a voltage level that is amplifiable by the output buffer 63. The output circuit 53 handles one differential clock pair among the four-phase clock signals 61. The phase interpolator 7 incorporates two systems, one for a differential clock pair of 0 and 180 degrees and the other for a differential clock pair of 90 and 270 degrees. Namely, in the phase interpolator 7, a combination of the output circuit 53, mixer 52, and IDAC controller 51 is prepared for the differential clock pair of 0 and 180 degrees, and another combination of the same is prepared for the differential clock pair of 90 and 270 degrees. The following explanation is conducted only for one of them, and it should be understood that the same explanation is applicable to the other.

Figure 4:
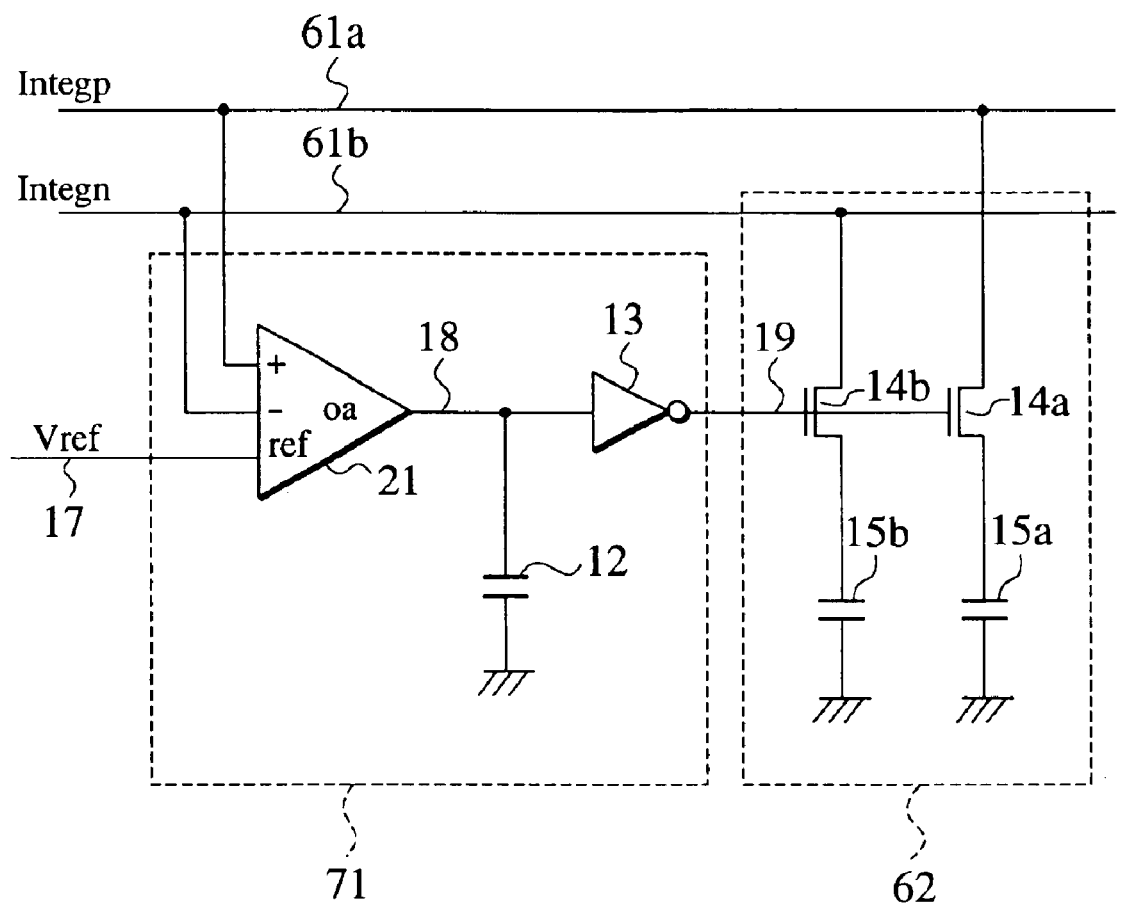
FIG. 4 is a circuit diagram showing examples of the controller 71 and integrator 62 according to a first embodiment of the present invention.

FIG. 4 is a circuit diagram showing examples of the controller 71 and integrator 62 according to a first embodiment of the present invention. The controller 71 has an operational amplifier 21, a capacitor 12, and an inverter 13. The integrator 62 has an NMOS transistor 14a connected to one (61a) of the differential clock signals, a capacitor 15a connected to the NMOS transistor 14a, an NMOS transistor 14b connected to the other (61b) of the differential clock signals, and a capacitor 15b connected to the NMOS transistor 14b. The operational amplifier 21 finds a difference between the positive signal 61a or Integp and the negative signal 61b (an inverted signal due to the CML) or Integn. The operational amplifier 21 then compares the found differential voltage with a reference signal 17 or Vref. If the differential voltage is smaller than the reference signal Vref, the operational amplifier 21 provides a detected signal. Here, the capacitor 12 is able to prevent a switching of the inverter 13 upon first receiving a detected signal. Namely, only when the differential voltage is smaller than the reference signal Vref several times, does the output of the operational amplifier 21 make the voltage of a node 18 exceed a threshold of the inverter 13, so that the inverter 13 may provide an OFF signal to a line 19. The OFF signal turns off the NMOS transistors 14a and 14b so as to disconnect the capacitors 15a and 15b of the integrator 62. As a result, the capacitance of the integrator 62 decreases, quickening the rise of each clock edge and restoring the amplitude of the clock signals. Here, capacitance means a function of accumulating charge and includes wiring load capacitance and input terminal capacitance.

According to the embodiment, the capacitor 12 accumulates a predetermined amount of charge. According to another embodiment, the capacitor 12 may be omitted. In this case, a single pulse of a detected signal makes the voltage of the node 18 exceed the threshold of the inverter 13, thus providing an OFF signal to the line 19. In this way, if it is necessary to invert a signal after one or a small number occurrences of the differential voltage becoming smaller than the reference signal Vref, the capacitor 12 can be omitted or replaced with a smaller one. If it is necessary to invert a signal after a larger number of times of such occurrence, the capacitor 12 can be replaced with a larger one.

Figure 5:
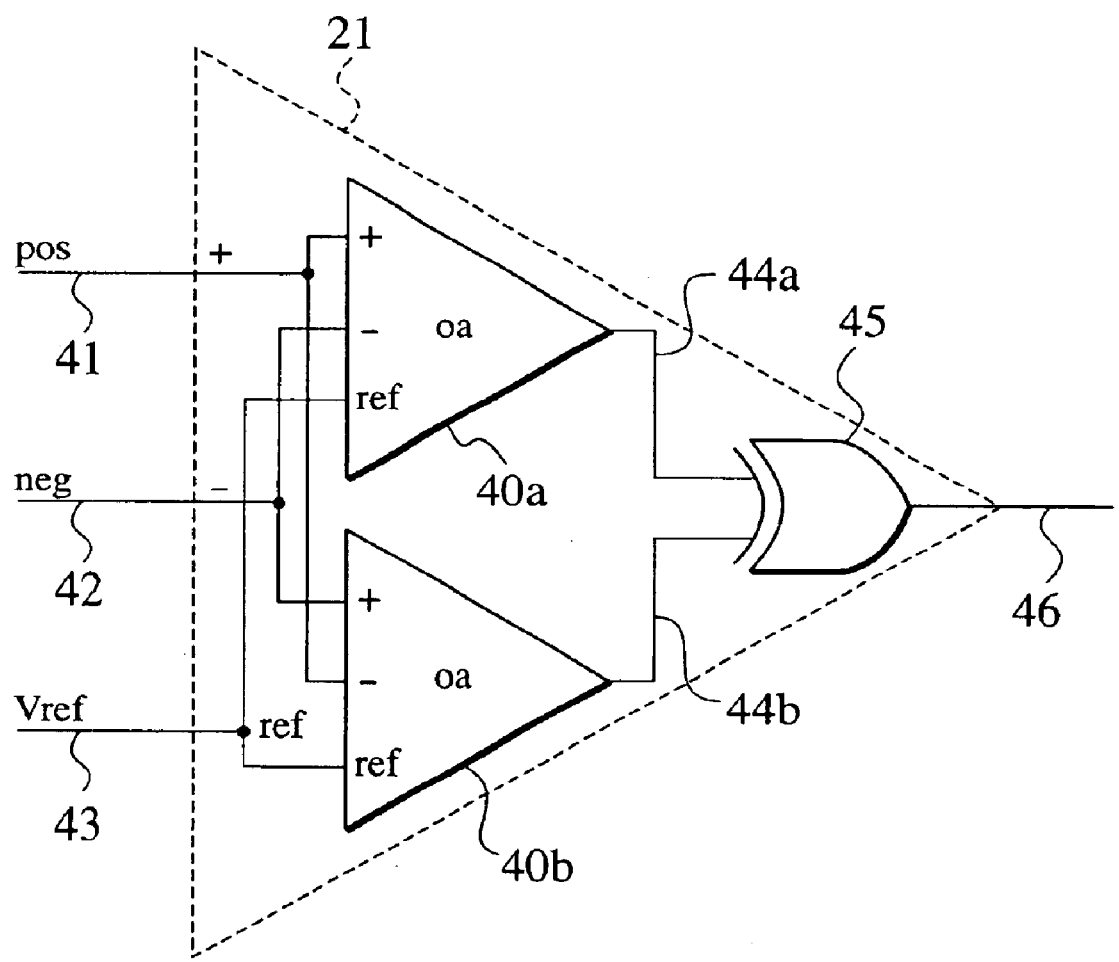
FIG. 5 shows an example of the operational amplifier 21 of FIG. 4.

FIG. 5 shows an example of the operational amplifier 21 of FIG. 4. According to this example, the operational amplifier 21 has operational amplifiers 40a and 40b. Each of the operational amplifiers 40a and 40b finds a difference between a positive signal 41 and a negative signal 42 and compares the difference with a reference signal 43. If any one of the differences "positive signal 41—negative signal 42" and "negative signal 42—positive signal 41" is smaller than the reference signal 43, an exclusive OR gate 45 causes an inversion to provide a high output signal 46. This results in accumulating charge in the capacitor 12. If this consecutively occurs several times, the accumulated charge exceeds the threshold of the inverter 13, which then provides an inverted signal.

Figure 6:
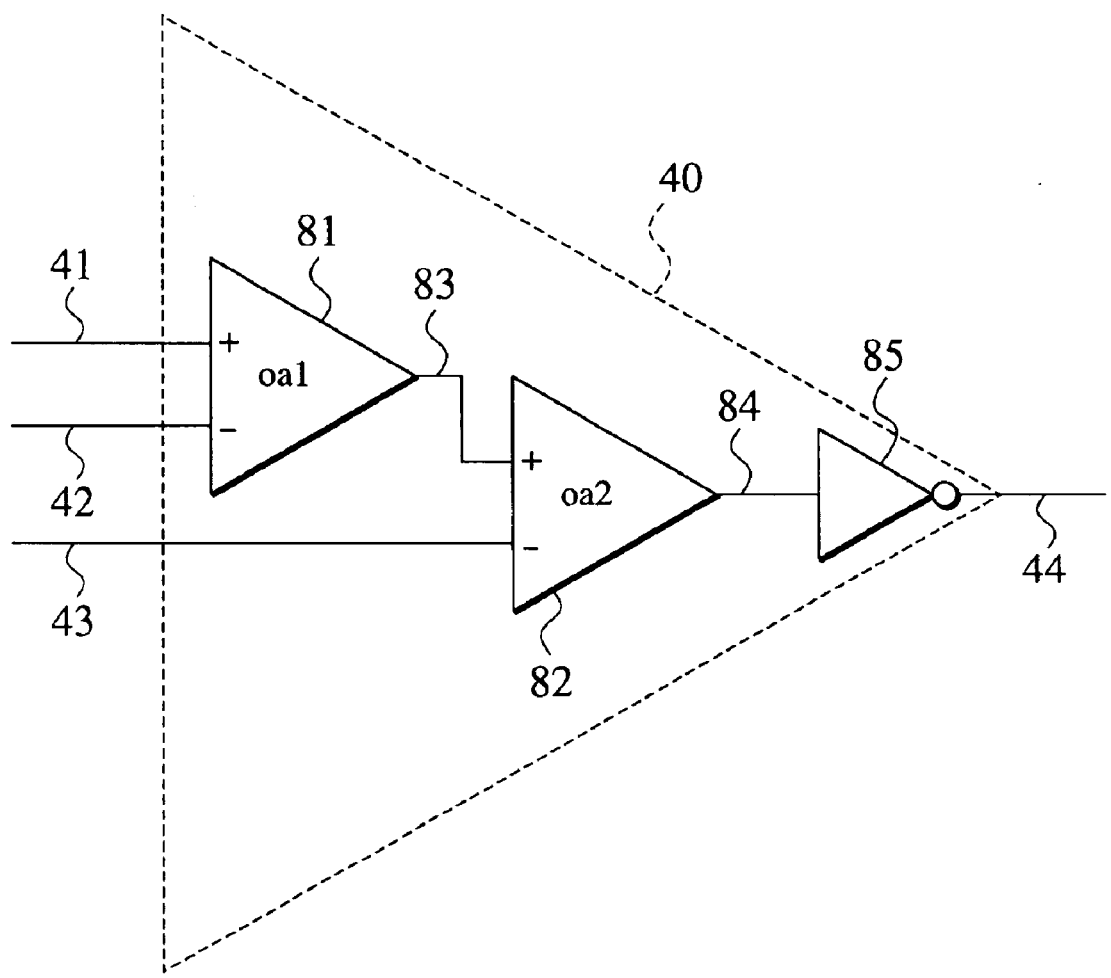
FIG. 6 shows an example of one of the operational amplifiers 40a and 40b of FIG. 5.

FIG. 6 shows an example of one of the operational amplifiers 40a and 40b of FIG. 5. An operational amplifier 81 compares the positive signal 41 with the negative signal 42 and provides a difference between them as a signal 83. An operational amplifier 82 compares the signal 83 with the reference signal 43. If the signal 83 is greater than the reference signal 43, it is considered that the signals are amplifiable by the output buffer 63, and the amplifier 82 provides a high output signal 84, which is inverted by an inverter 85 into a low signal 44. If the operational amplifier 82 determines that the signal 83 is lower than the reference signal 43, it is determined that the signals are not amplifiable by the output buffer 63. Then the operational amplifier 82 provides a low output signal 84, which is inverted by the inverter 85 into a high output signal 44.

Figure 7:
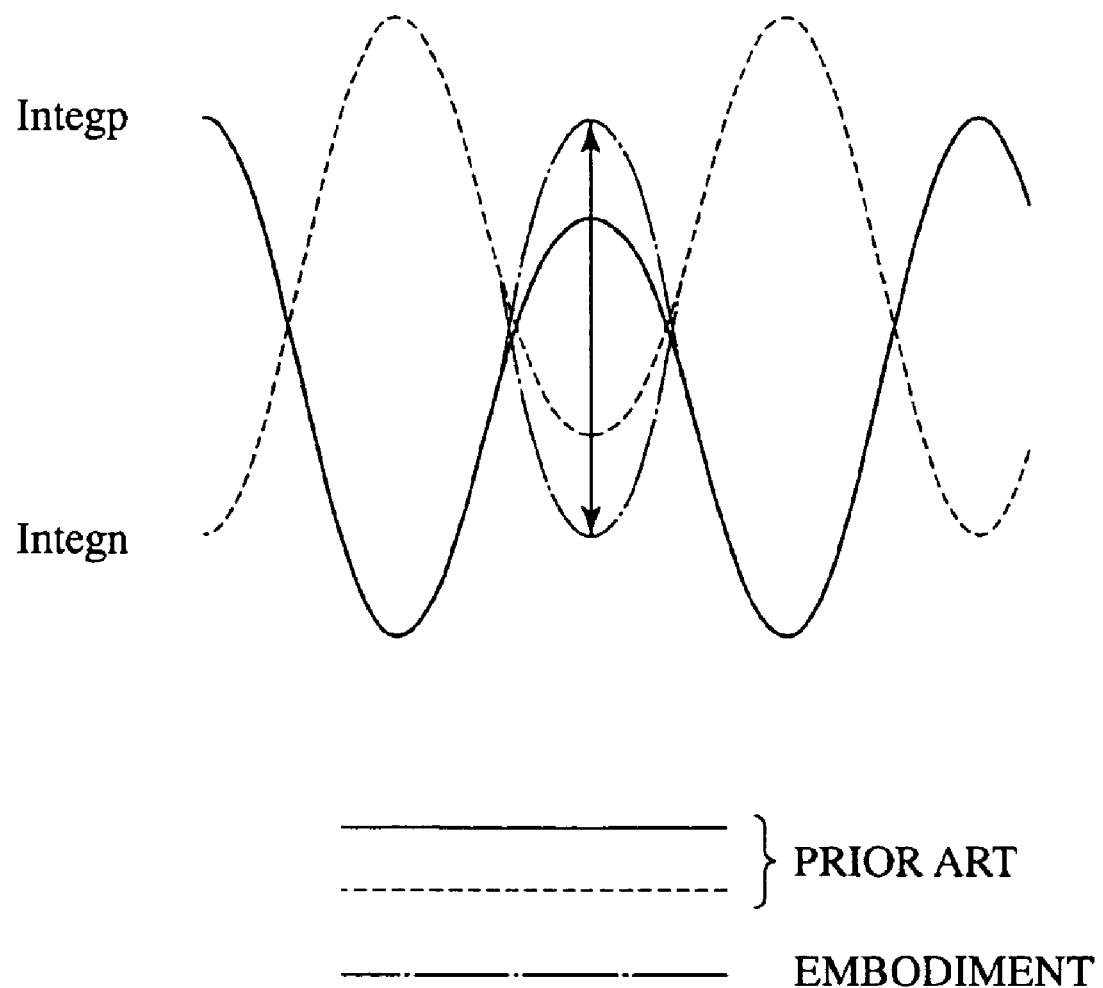
FIG. 7 explains amplitude expansion according to the embodiment.

FIG. 7 explains amplitude expansion according to the embodiment. In the controller 71, the voltage of the node 18 may exceed the threshold of the inverter 13, to provide an OFF signal to the line 19. This OFF signal turns off the NMOS transistors 14 to disconnect the capacitors 15 of the integrator 62. This reduces the capacitance of the integrator 62, quickening the rise of each clock edge and restoring the amplitude of each clock signal. This controls changes exerted by the integrator 62 on the differential clock signals, expands amplitude (dot-and-dash lines) more than the related art (solid and broken lines), and enables all signals to be amplified by the output buffer 63. Consequently, the embodiment allows the data read circuit 6 to correctly recognize all clock signals and correctly read data, prevents the destruction of duty ratios of clock signals due to phase shift in the clock signals, and ensures data read operation through phase adjustment between data and clock signals.

Figure 8:
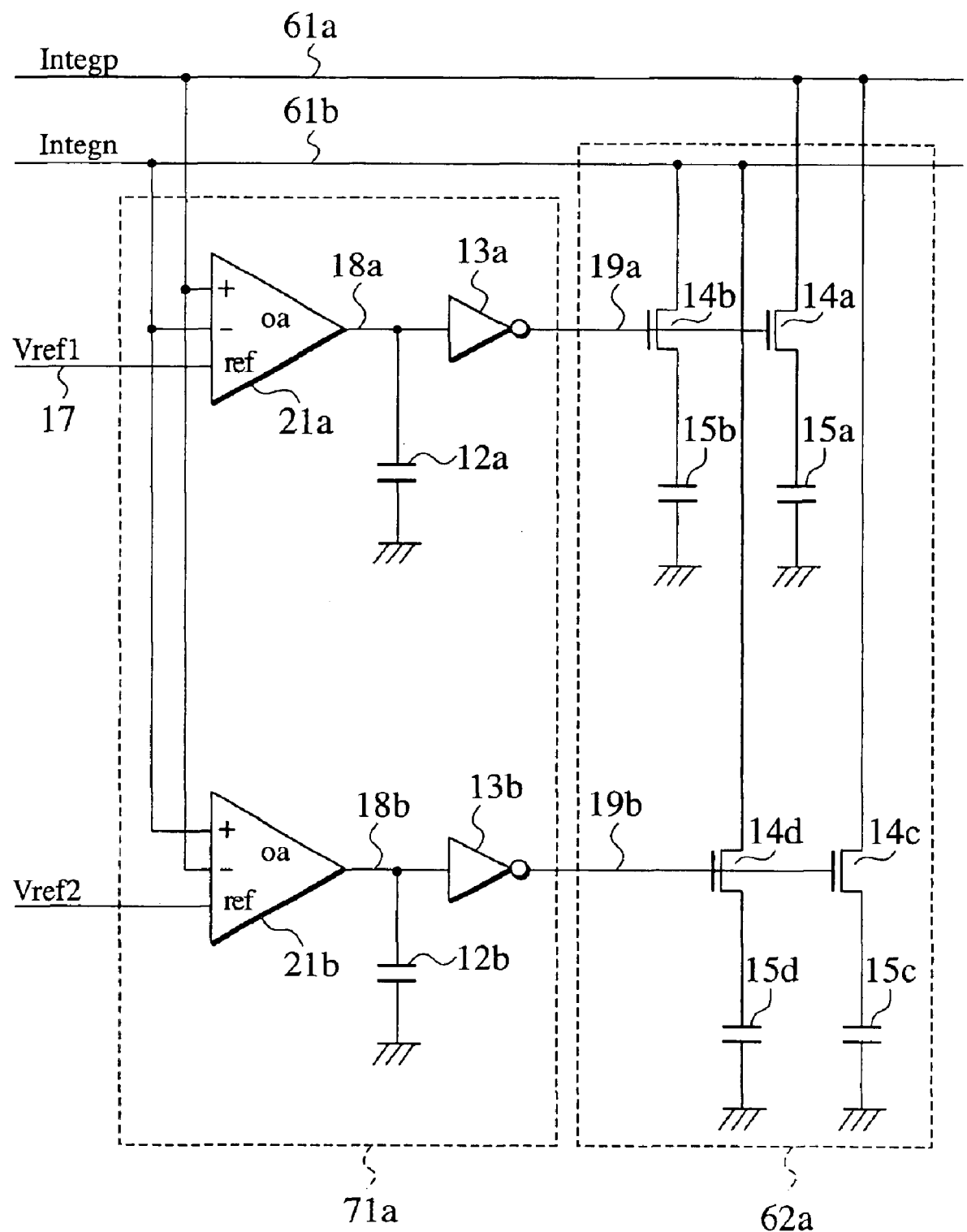
FIG. 8 is a circuit diagram showing examples (71a, 62a) of the controller 71 and integrator 62 according to a second embodiment of the present invention.

FIG. 8 is a circuit diagram showing examples (71a, 62a) of the controller 71 and integrator 62 according to a second embodiment of the present invention. Compared with FIG. 4, the controller 71a has two operational amplifiers 21a and 21b that receive different reference signals Vref1 and Vref2, respectively. The operational amplifier 21a finds a difference between the signals Integp and Integn and compares the differential voltage with the reference signal Vref1. If the differential voltage is smaller than the reference signal Vref1, a predetermined amount of charge is accumulated in a capacitor 12a. On the other hand, the operational amplifier 21b finds a difference between the signals Integp and Integn and compares the differential voltage with the reference signal Vref2. If the differential voltage is smaller than the reference signal Vref2, a predetermined amount of charge is accumulated in a capacitor 12b. Based on these different standards, the operational amplifiers 21a and 21b turn off NMOS transistors 14 and disconnect capacitors 15 of the integrator 62a. For example, the reference signals Vref1 and Vref2 are set to Vref1>Vref2. The operational amplifier 21b that receives the reference signal Vref2 may have no capacitor. That results that an inverter 13b inverts in response to a single input pulse. The capacitors 15a and 15b and the capacitors 15c and 15d may have different capacitance values. That results in differ load of the capacitance when the NMOS transistors 14 are turned off. According to the capacitance of the disconnected capacitors, the rising speed of each clock edge changes so as to control the degree of restoration of clock amplitude. This technique realizes precise control of clock amplitude.

Figure 9:
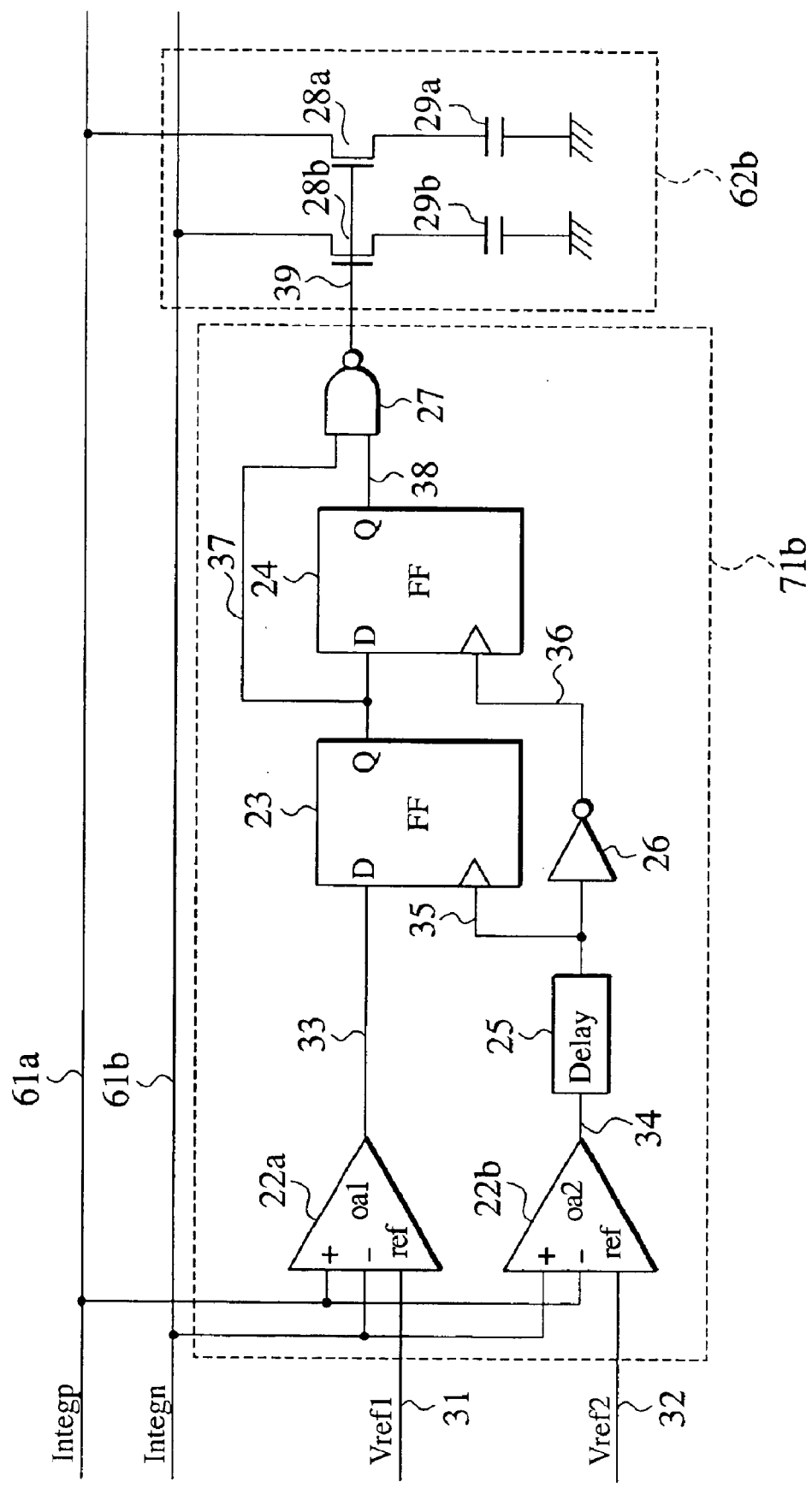
FIG. 9 is a circuit diagram showing examples (71b, 62b) of the controller 71 and integrator 62 according to a third embodiment of the present invention.

FIG. 9 is a circuit diagram showing examples (71b, 62b) of the controller 71 and integrator 62 according to a third embodiment of the present invention. The controller 71b has an operational amplifier 22a that receives the signals Integp, Integn, and Vref1, an operational amplifier 22b for receiving the signals Integp, Integn, and Vref2, a delay circuit 25 for delaying the output of the operational amplifier 22b, a flip-flop (FF) for receiving the output of the delay circuit 25 at a clock input terminal and the output of the operational amplifier 22a at an input terminal, an inverter 26 for inverting the output of the delay circuit 25, a flip-flop 24 for receiving the output of the inverter 26 at a clock input terminal and the output of the flop-flop 23 at an input terminal, and a NAND gate 27 for receiving the outputs of the flip-flops 23 and 24 and providing a NAND of the received signals. The controller 71b is an example of a counter circuit. The operational amplifier 22a receives the signals Integp and Integn (61a and 61b), finds a difference between them, and compares the difference with the reference signal Vref1. If the difference is smaller than the reference signal Vref1, the operational amplifier 22a provides an output signal 33. Similarly, the operational amplifier 22b finds a difference between the signals Integp and Integn and compares the difference with the reference signal Vref2. Here, the reference signal Vref2 is set to have a voltage level that always generates clock signals. Accordingly, an output signal 34 from the operational amplifier 22b generates clock signals. The operational amplifiers 22a and 22b may have the same structures as those of FIGS. 5 and 6. The output signal 34 is slightly delayed by the delay circuit 25 so that the output signal 33 is properly received by the FF 23. The signal 33 hit by a clock signal 35 from the delay circuit 25 is sent to the next FF 24. The clock signal 35 is inverted by the inverter 26, and a half-clock-shifted clock signal 36 hits the FF 24, which provides a signal 38. Signals 37 and 38 are passed to the NAND gate 27. During a high period of the signal 33, i.e., only when voltage variations are outside of an allowable range, does the NAND gate 27 provide a low signal 39 to turn off NMOS transistors 28a and 28b and disconnect capacitors 29a and 29b of the integrator 62b. This reduces the capacitance of the integrator 62b, quickening the rise of each clock edge and restoring clock amplitude. This embodiment employs two flip-flop stages so that a switching operation may take place only when the reference signal 31 has been exceeded at least two times. It is possible to employ three, four, or more flip-flop stages, so as to trigger a switching operation upon three or more occurrences of exceeding the reference signal. In this way, the configuration of FIG. 9 is capable of defining the number of occurrences necessary to trigger a switching operation. The structure of FIG. 9 can turn off the NMOS transistors 28a and 28b upon two occurrences of the difference between the signals Integp and Integn (61a and 61b) being below the reference signal Vref1. It is thus possible to optionally set the number of occurrences of the difference between the signals Integp and Integn being lower than the reference signal Vref1 to turn off the NMOS transistors 28a and 28b.

Figure 10:
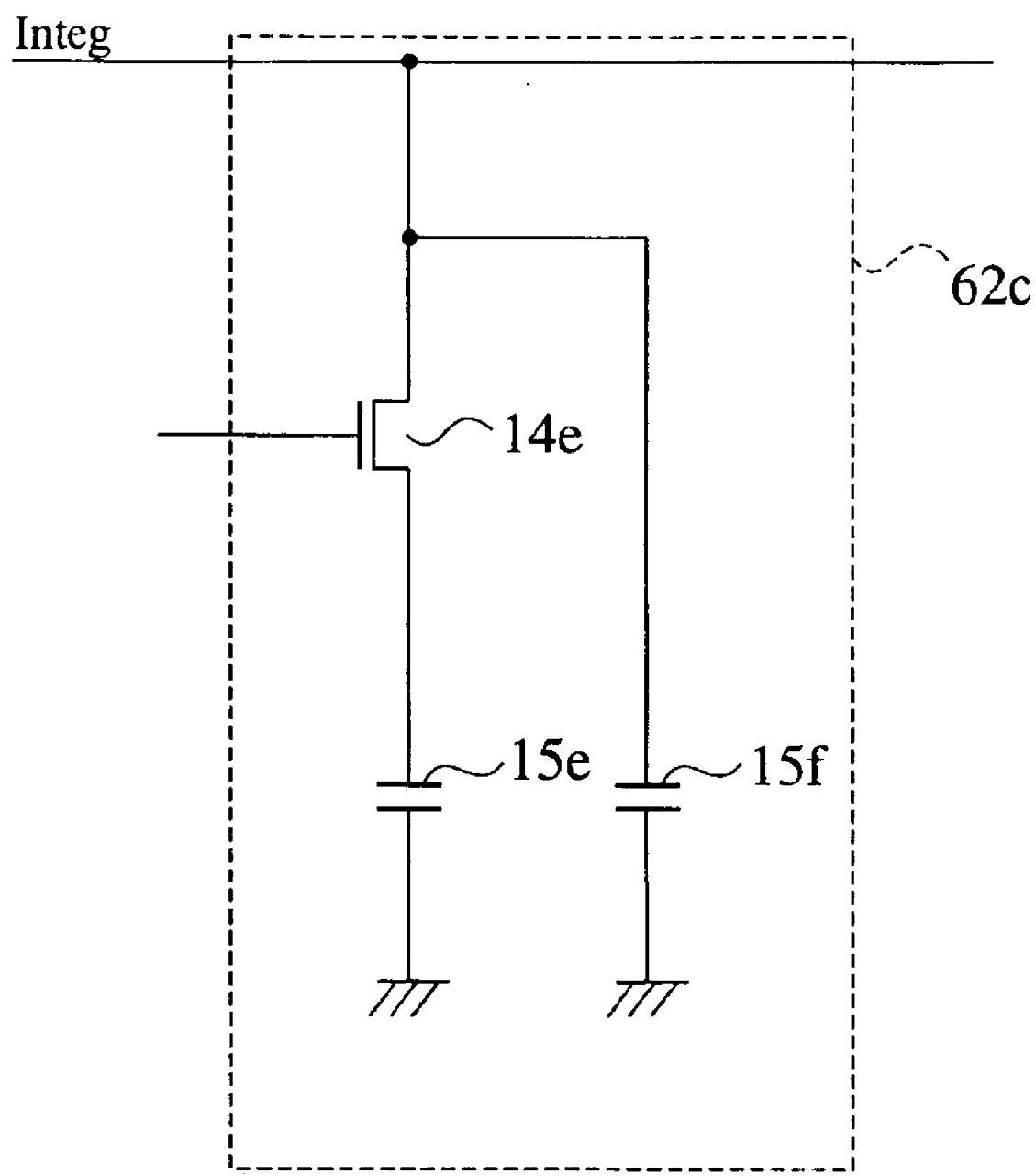
FIG. 10 shows another example (62c) of the integrator 62. This example halves the capacitance of the integrator 62c in an OFF operation, instead of completely disconnecting the capacitance.
Figure 11:
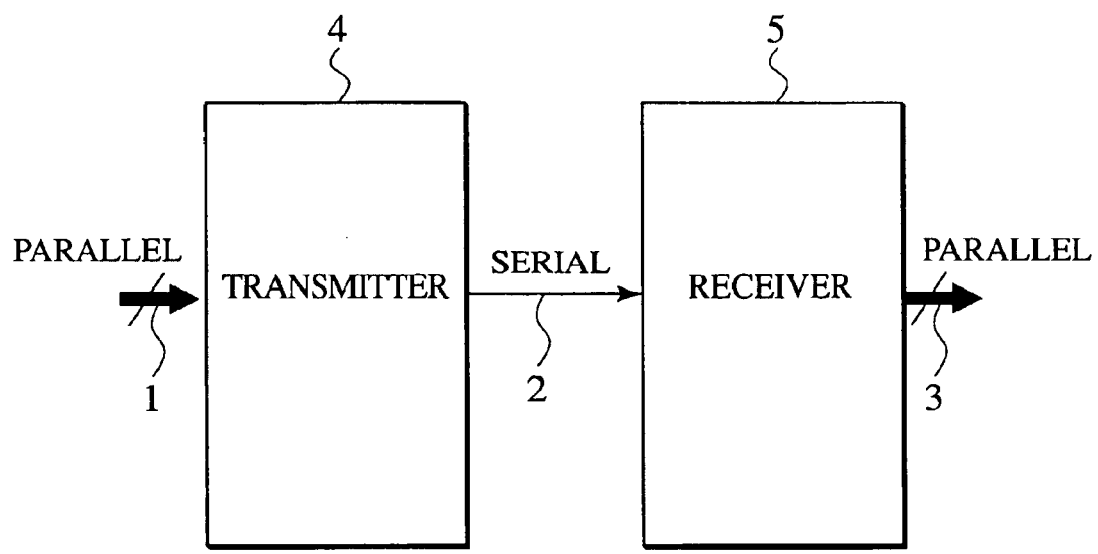
FIG. 11 is a block diagram showing a high-speed input/output (I/O) device.
Figure 12:
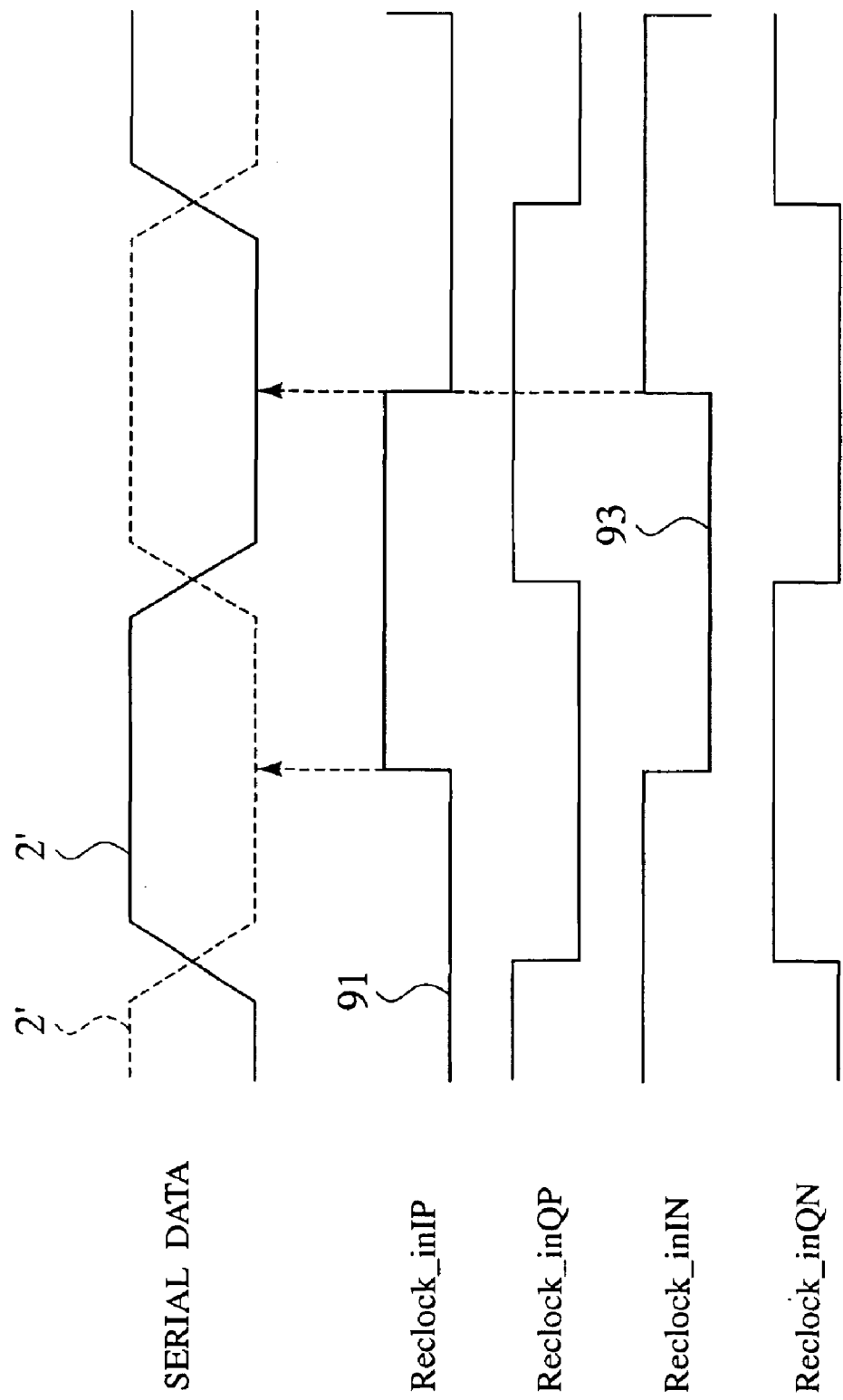
FIG. 12 is a timing chart showing serial data 2' supplied to a data read circuit and four-phase clock signals provided from a phase interpolator to the data read circuit.
Figure 13:
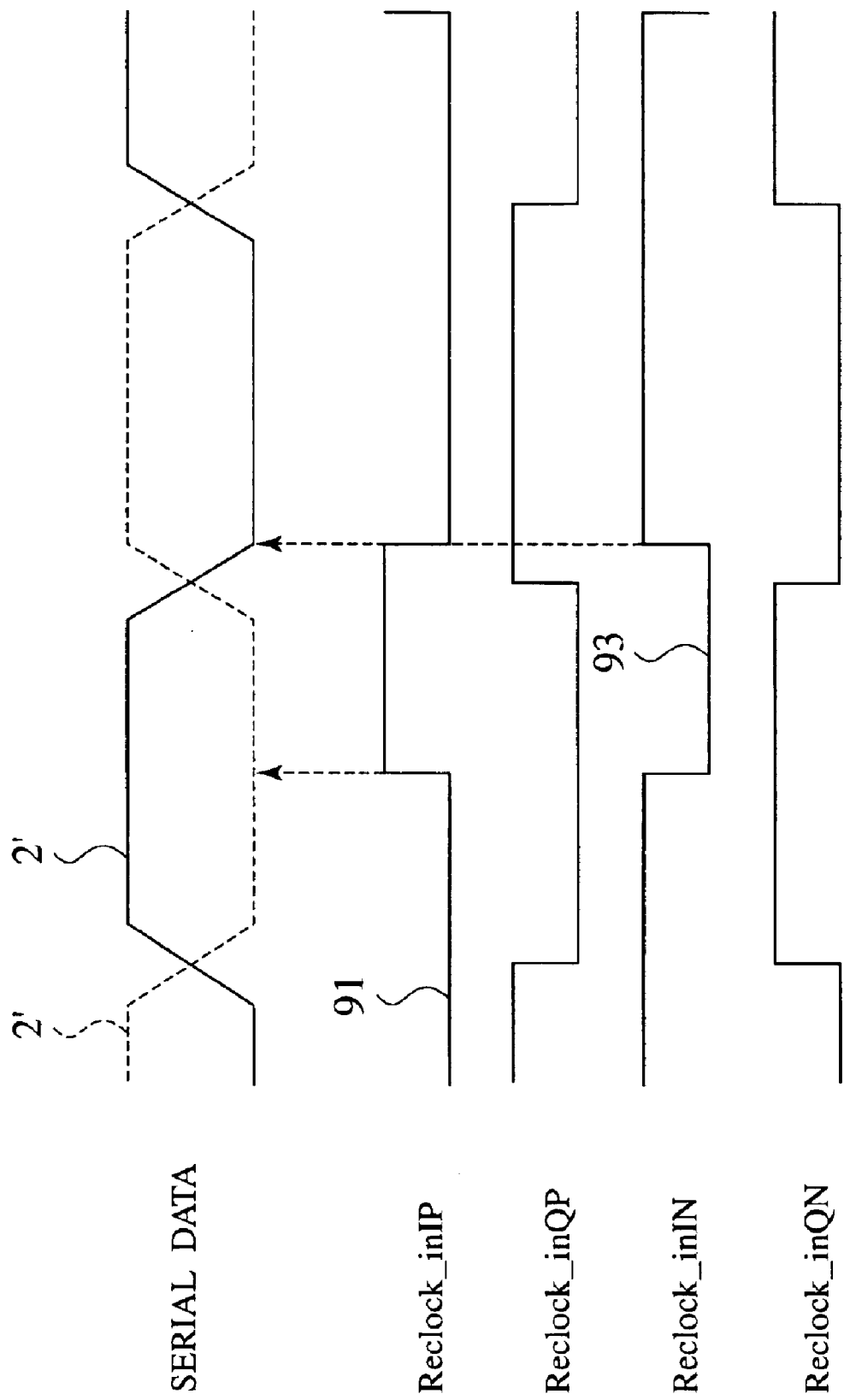
FIG. 13 is a timing chart showing the clock signals Reclock_InIP 91 and Reclock_InIN 93 that have an improper duty ratio deviating from a proper duty ratio of 50:50.
Figure 14:
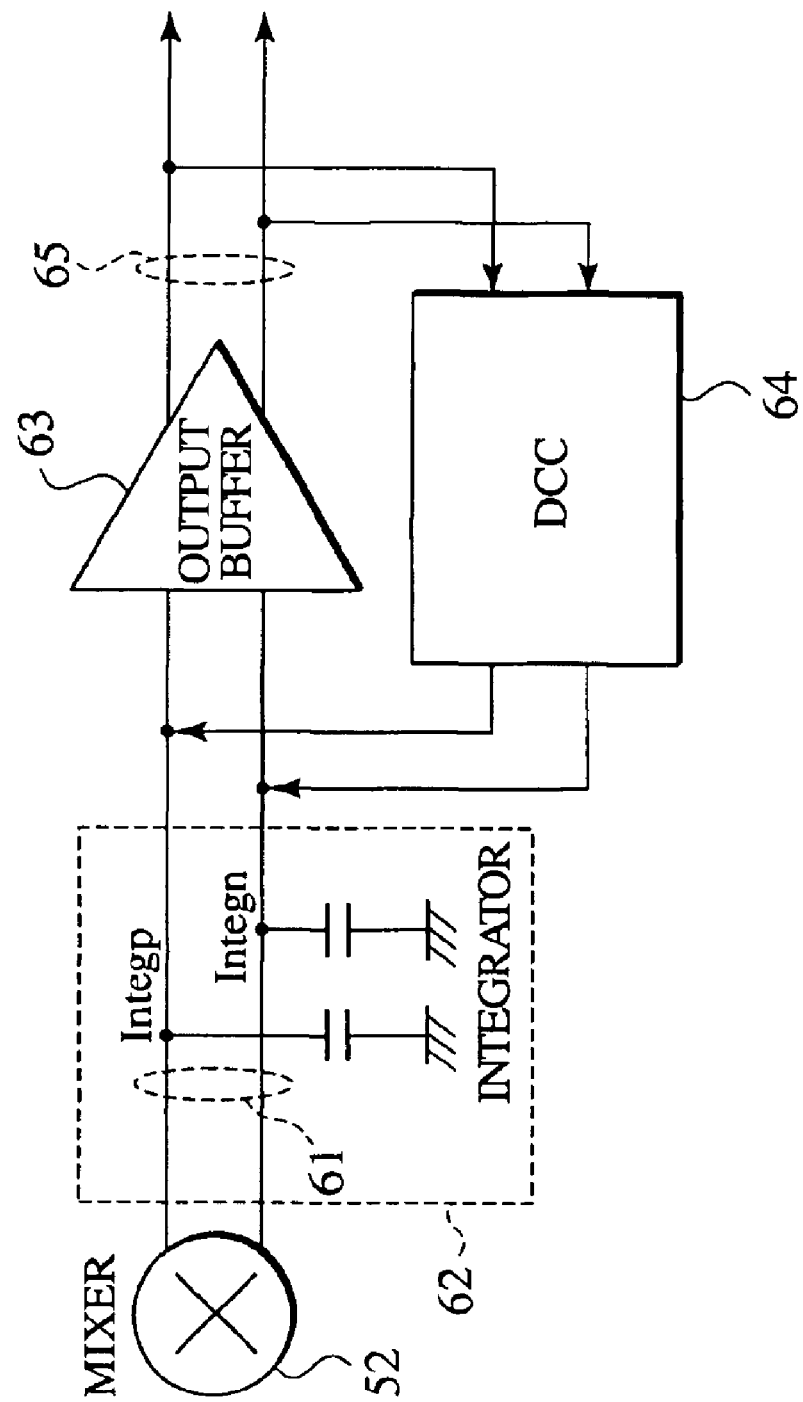
FIG. 14 is a schematic view showing an output circuit of a phase interpolator according to a related art.
Figure 15:
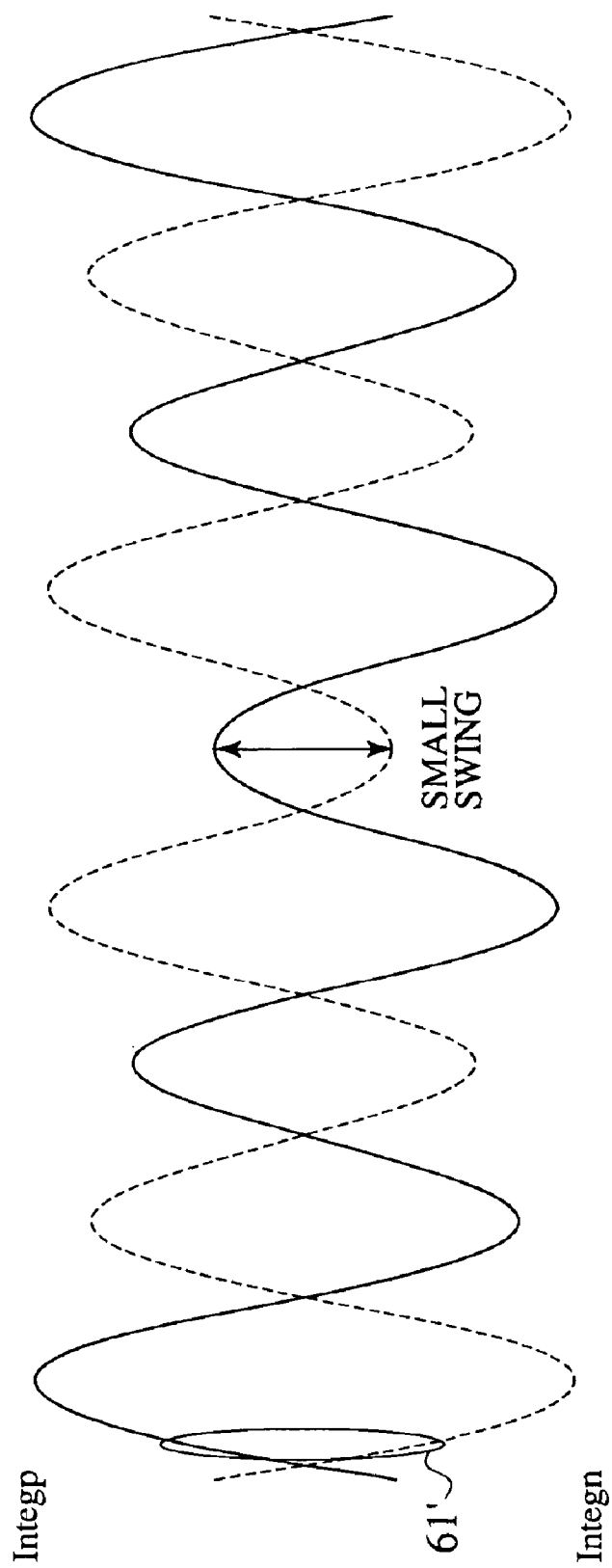
FIG. 15 is a diagram showing signals 61' that are affected by voltage fluctuations.

FIG. 10 shows another example (62c) of the integrator 62. This example halves the capacitance of the integrator 62c in an OFF operation, instead of completely disconnecting the capacitance. More precisely, one capacitor 15e of the integrator 62c is configured so as to be switched off with an NMOS transistor 14e, and the other capacitor 14f thereof is fixed. Even if the NMOS transistor 14e is turned off so as to disconnect the capacitor 15e, the capacitor 15f remains active, thus restricting the rise of each clock edge.

Although this example employs only one switching element, more reference signals and more switching stages may be employed in order to precisely control the capacitance of the integrator. Voltage applied to the switching elements may analogously be controlled in response to a voltage difference between the signals 61, in order to analogously control the capacitance of the integrator.

As explained above, the phase interpolator and receiver according to any one of the embodiments of the present invention determine, with a controller incorporated in the phase interpolator, whether or not the voltage of signals from a mixer is amplifiable by an output buffer, and according to a result of the determination, change the capacitance of an integrator incorporated in the phase interpolator. By changing the capacitance of the integrator, the phase interpolator controls the rising speed of each clock edge and restores the amplitude of clock signals so that the clock signals may have voltage levels amplifiable by the output buffer. This results in providing correct clock signals that correctly hit data in a data read circuit and ensure the normal operation of the receiver.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A phase interpolator for adjusting a phase of differential clock signals of a receiver to a phase of a data from a transmitter, the phase interpolator comprising:

an integrator configured to slew output signals of a mixer connectable to the interpolator, the mixer outputting said differential clock signals and configured to change swings of the differential clock signals to change capacitance in the integrator upon receiving a signal from a controller;

an output buffet configured to amplify output signals of the integrator, a duty cycle correction circuit configured to receive the amplified signals from the output buffer and adjust duty ratios of the output signals of the output buffer to output adjusted differential clock signals; and the controller configured to receive the adjusted differential clock signals and determine whether or not voltages of the adjusted differential signals are amplifiable by the output buffer, the controller configured to output the signal to the integrator to change capacitance of the integrator, wherein the controller comprises: a first comparison unit configured to determine whether or not the adjusted differential clock signals and the swings of the differential clock signals satisfy a standard voltage that the output buffer is able to amplify, wherein an output of the first comparison unit is coupled to a capacitor and an inverter to switch the inverter when a voltage of the output of the first comparison unit reaches a predetermined voltage, wherein an output of the inverter is coupled to a gate of an NMOS transistor, wherein the NMOS transistor is coupled to the capacitor in the integrator and the adjusted differential clock signal, wherein the integrator is configured to change a capacitance of a capacitor in the integrator in accordance with switching the gate of the NMOS transistor.

2. The phase interpolator as claimed in claim 1, wherein the controller comprises:

a second comparison unit configured to determine whether or not the adjusted differential clock signals and the swings of the differential clock signals satisfy a predetermined voltage that the output buffer is able to amplify;

a third comparison unit configured to generate a clock using the adjusted differential clock signals;

wherein an output of the second comparison unit is coupled to a data input of a first flip-flop, wherein an output of the third comparison unit is coupled to a delay circuit configured to generate a delayed clock signal from the output of the third comparison unit, wherein the first flip-flop receives the delayed clock signal to process the output of the second comparison unit to output an output signal, wherein a data input of a second flip-flop and a NAND gate receives the output signal, wherein a clock input of the second flip-flop receives delayed clock signal and processes the output of the first flip-flop to output a second output signal to the NAND gate, wherein an output of the NAND gate is coupled to a gate of an NMOS transistor, wherein the NMOS transistor is coupled to the capacitor in the integrator and the adjusted differential clock signal, wherein the integrator is configured to change a capacitance in the integrator to switch the gate of the NMOS transistor off when a differential voltage of the adjusted differential clock signal is smaller than a predetermined voltage.

3. The phase interpolator as claimed in claim 1, wherein the first comparison unit comprises:

a fourth comparison unit including:
  a positive input port configured to receive a first signal;
  a negative input port configured to receive a second signal; and
  a reference input port configured to receive a third signal;
a fifth comparison unit including:
  a positive input port configured to receive the second signal;
  a negative input port configured to receive the first signal; and
  a reference input port configured to receive the third signal; and
an EXOR gate configured to receive an output of the fourth comparison unit and fifth comparison unit to output an exclusive OR operation of the fourth comparison unit and fifth comparison unit.

4. The phase interpolator as claimed in claim 3, wherein the fourth comparison unit and the fifth comparison unit comprise:
  a sixth comparison unit including:
    a positive input port configured to receive a fourth signal; and
    a negative input port configured to receive a fifth signal;
  a seventh comparison unit including:
    a positive input port configured to receive an output of the sixth comparison unit; and
    a negative input port configured to receive a sixth signal; and
  an inverter configured to receive an output of the seventh comparison unit to invert the output of the seventh comparison unit.

5. The phase interpolator as claimed in claim 3, wherein the controller includes a circuit configured to control the capacitance in the integrator, so as not to allow the swings to drop lower than a predetermined value.

6. The phase interpolator as claimed in claim 1, wherein the controller comprises a first operational amplifier configured to determine whether or not the swings of the adjusted differential clock signals and the differential clock signals are amplifiable by the output buffer,
  wherein an output of the first operational amplifier is coupled to the capacitor and the inverter,
  wherein the first operational amplifier comprises:
    a second operational amplifier including:
      a positive input port configured to receive a first differential clock signal;
      a negative input port configured to receive a second differential clock signal; and
      a reference input port configured to receive a reference signal;
    a third operational amplifier including:
      a positive input port configured to receive the second differential clock signal;
      a negative input port configured to receive the first signal; and
      a reference input port configured to receive the reference signal; and
    an EXOR gate configured to receive an output of the second operational amplifier and third operational amplifier to output an exclusive OR operation of the second operational amplifier and third operational amplifier,
  wherein the second and third operational amplifier comprise:

a fourth operational amplifier configured to output a comparison signal, the fourth operational amplifier including:
  a positive input port configured to receive the first differential clock signal; and
  a negative input port configured to receive the second differential clock signal;
a fifth operational amplifier including:
  a positive input port configured to receive the comparison signal; and
  a negative input port configured to receive the reference signal;
an inverter configured to receive an output of the fifth operational amplifier to invert the output of the fifth operational amplifier.

7. The phase interpolator as claimed in claim 1, wherein the controller comprises:
  a first operational amplifier configured to determine whether or not adjusted differential clock signals and the swings of the differential clock signals satisfy a predetermined voltage that the output buffer is able to amplify;
  a second operational amplifier configured to generate a clock using the adjusted differential clock signals;
  wherein an output of the first operational amplifier is coupled to a data input of a first flip-flop, wherein an output of the second operational amplifier is coupled to a delay circuit configured to generate a delayed clock signal from the output of the second operational amplifier, wherein the first flip-flop receives the delayed clock signal to hit the output of the first operational amplifier to output an output signal, wherein a data input of a second flip-flop and a NAND gate receives the output signal, wherein a clock input of the second flip-flop receives delayed clock signal and processes the output of the first flip-flop to output a second output signal to the NAND gate, wherein an output of the NAND gate is coupled to a gate of the NMOS transistor, wherein the integrator is configured to change the capacitance of the capacitor in the integrator to switch the gate of the NMOS transistor off when a differential voltage of the adjusted differential clock signals is smaller than a predetermined voltage,
  wherein the first and second operational amplifier comprise:
    a third operational amplifier including:
      a positive input port configured to receive a first differential clock signal;
      a negative input port configured to receive a second differential clock signal; and
      a reference input port configured to receive a reference signal,
    a fourth operational amplifier including:
      a positive input port configured to receive the second differential clock signal;
      a negative input port configured to receive the first differential clock signal; and
      a reference input port configured to receive the reference signal; and
    an EXOR gate configured to receive an output of the third operational amplifier and the fourth operational amplifier to output an exclusive OR operation of the third operational amplifier and the fourth operational amplifier,
  wherein the third and fourth operational amplifier comprise:

a fifth operational amplifier including:
  a positive input port configured to receive the first differential clock; and
  a negative input port configured to receive the second differential clock;
a sixth operational amplifier including:
  a positive input port configured to receive an output of the fifth operational amplifier; and
  a negative input port configured to receive the reference signal; and
an inverter configured to receive an output of the sixth operational amplifier to invert the output of the sixth operational amplifier.

8. A phase interpolator comprising:
an integrator configured to receive output signals of a mixer connectable to the interpolator and configured to slew differential clock signals outputting from the mixer;
an output buffer configured to amplify an output of the integrator;
a duty cycle correction circuit configured to receive amplified signals from the output buffer to adjust a duty ratio of the amplified signals, the duty cycle correction circuit configured to output the adjusted signals to the output buffer, and
a controller configured to control a rate of slewing the differential clock signals carried out by the integrator, when swings of the differential clock signals are below a predetermined value.

9. The phase interpolator as claimed in claim 8, wherein the controller comprises:
a first comparison unit configured to receive the adjusted differential clock signals and a first reference signal to compare a difference between the adjusted differential clock signals with the first reference signal, the first comparison unit configured to output a first detection signal when the difference is smaller than the first reference signal; and
a first inverter configured to receive the first detection signal in order to invert the first detection signal.

10. The phase interpolator as claimed in claim 9, wherein the controller comprises a first capacitor configured to store electrical charges of the first detection signal, wherein the first inverter switches the output signal when an output node coupled to the first capacitor reaches a predetermined voltage.

11. The phase interpolator as claimed in claim 10, wherein the integrator comprises:
a second capacitor; and
a switching circuit coupled to the second capacitor, the switching circuit configured to control the second capacitor according to an output of the first inverter.

12. The phase interpolator as claimed in claim 11, wherein the switching circuit is a transistor, wherein the integrator further comprises a third capacitor coupled to a drain of the transistor.

13. The phase interpolator as claimed in claim 9, wherein the first comparison unit, comprises:
a second comparison unit configured to receive a first voltage according to a first signal of the differential clock signals, a second voltage according to a second signal of the differential clock signals and a reference voltage according to a reference signal to compare a voltage subtracts the second voltage from the first voltage with the reference voltage;

a third comparison unit configured to receive the first voltage, the second voltage, and the reference voltage in order to compare a voltage that is the first voltage subtracted from the second voltage with the reference voltage; and
an EXOR gate configured to receive the outputs of the second and third comparison units to output an exclusive OR operation of the outputs of the second and third comparison units.

14. The phase interpolator as claimed in claim 13, wherein at least one of the fourth and fifth comparison unit comprise:
a fourth comparison unit configured to receive the first and second voltages to output a voltage that is a subtraction of the second voltage from the first voltage;
a fifth comparison unit configured to receive an output voltage of the fourth comparison unit and the reference voltage to output a voltage that is a subtraction of the reference voltage from the output voltage of the fourth comparison unit; and;
a second inverter configured to receive an output of the fifth comparison unit to invert the output of the fifth comparison unit.

15. The phase interpolator as claimed in claim 8, wherein the controller comprises:
a first comparison unit configured to receive the differential clock signals and a second reference signal to compare a difference between the differential clock signal, with the second reference signal, the first comparison unit configured to output a second detection signal when the difference is smaller than the second reference signal;
a second comparison unit configured to generate a clock signal using the differential clock signals;
a delay circuit configured to delay an output of the second comparison unit;
a first flip-flop configured to receive an output of the first comparison unit as a first data signal and an output of the delay circuit as a first clock signal to output the first data signal at a predetermined timing;
a first inverter configured to receive the output signal of the delay circuit and to invert the output signal of the delay circuit;
a second flip-flop configured to receive an output of the first flip-flop as a second data signal and an output of the first inverter as a second clock signal to output the second data signal at a predetermined timing; and
a NAND gate configured to receive the outputs of the first and second flip-flops to output negative AND operation of the outputs of the first and second flip-flops.

16. The phase interpolator as claimed in claim 15, wherein at least one of the first, second, and third comparison units comprise:
a third comparison unit configured to receive a first voltage according to a first signal of the differential clock signals, a second voltage according to a second signal of the differential clock signal, and a reference voltage according to a reference signal to compare a voltage that subtracts the second voltage from the first voltage with the reference voltage;
a fourth comparison unit configured to receive the first voltage, the second voltage, and the reference voltage to compare a voltage that subtracts the first voltage from the second voltage with the reference voltage; and
an EXOR gate configured to receive the outputs of the third and fourth comparison units to output an exclusive OR operation of the outputs of the third and fourth comparison units.

17. The phase interpolator as claimed in claim 16, wherein at least one of the fourth and fifth comparison units comprises:

a fifth comparison unit configured to receive the first and second voltages to output a voltage that subtracts the second voltage from the first voltage;

a sixth comparison unit configured to receive an output voltage of the fifth comparison unit and the reference voltage to output a voltage that subtracts the reference voltage from the output voltage of the fifth comparison unit; and a second inverter configured to receive an output of the sixth comparison unit and to invert the output of the sixth comparison unit.

18. A phase interpolator comprising:

a digital-analog converter configured to convert an inputted signal into a current;

a mixer configured to receive an output of the digital-analog converter and a clock, the mixer configured to shift a phase of the clock according to the output of the digital-analog converter to output adjusted differential clock signals;

an integrator configured to receive the adjusted differential clock signals and configured to slew the differential clock signals outputted from the mixer;

an output buffer configured to amplify an output of the integrator;

a duty cycle correction circuit configured to receive amplified signals from the output buffer to adjust duty ratios of the amplified signals, the duty cycle correction circuit configured to output the adjusted signals to the output buffer; and a controller configured to control a rate of the slewing the differential clock signals carried out by the integrator, when swings of the differential clock signals are below a predetermined value.

19. A receiver comprising:

a phase interpolator including:

a digital-analog converter configured to convert an inputted signal into a current;

a mixer configured to receive an output of the digital-analog converter and a clock, the mixer configured to shift a phase of the clock according to the output of the digital-analog converter to output adjusted differential clock signals;

an integrator configured to receive data and said adjusted differential clock signals and to slew the adjusted differential clock signals;

an output buffer configured to amplify an output of the integrator;

a duty cycle correction circuit configured to receive amplified signals from the output buffer to adjust duty ratios of the amplified signals the duty cycle correction circuit configured to output the adjusted signals to the output buffer; and a controller configured to control a rate of the slewing of the differential clock signals carried out by the integrator, when swings of the differential clock signals are below a predetermined value; and a data read unit configured to read data using the output of the output buffer.

* * * * *